(12) United States Patent
Lane (10) Patent No.: US 11,037,765 B2
(45) Date of Patent: Jun. 15, 2021

(54) RESONANT STRUCTURE FOR ELECTRON CYCLOTRON RESONANT (ECR) PLASMA IONIZATION

(71) Applicant: Tokyo Electron Limited, Tokyo (JP)

(72) Inventor: Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 125 days.

(21) Appl. No.: 16/027,123

(22) Filed: Jul. 3, 2018

(65) Prior Publication Data

US 2020/0013594 A1 Jan. 9, 2020

(51) Int. Cl.

| | |
|---|---|
| *H01J 37/32* | (2006.01) |
| *C23C 16/511* | (2006.01) |
| *H01L 21/687* | (2006.01) |
| *H05H 13/00* | (2006.01) |
| *H05H 1/46* | (2006.01) |

(52) U.S. Cl.
CPC ...... *H01J 37/32678* (2013.01); *C23C 16/511* (2013.01); *H01J 37/321* (2013.01); *H01J 37/3211* (2013.01); *H01J 37/32192* (2013.01); *H01J 37/32247* (2013.01); *H01J 37/32449* (2013.01); *H01J 37/32458* (2013.01); *H01J 37/32816* (2013.01); *H01L 21/68714* (2013.01); *H01J 2237/3321* (2013.01); *H01J 2237/3341* (2013.01); *H05H 2001/4607* (2013.01)

(58) Field of Classification Search
CPC .......... H01J 21/18; H01J 23/02; H01J 23/005; H01J 23/10; H01J 23/213; H01J 23/22; H01J 37/32678; H01J 2237/3321; H01J 2237/3341; H01J 1/50; H01J 17/14; H01J 37/321; H01J 37/3211; H01J 37/32192–3231; C23C 16/511; H05H 2001/4607–463
See application file for complete search history.

(56) References Cited

U.S. PATENT DOCUMENTS

| | | | | |
|---|---|---|---|---|
| 4,304,983 | A | * 12/1981 | Pierfederici | ...... H01J 37/32623 219/121.43 |
| 4,371,412 | A | * 2/1983 | Nishizawa | .............. H01J 37/16 118/723 I |

(Continued)

OTHER PUBLICATIONS

"Cyclotron-Resonance-Maser Arrays", Eli Jerby, Amit Kesar, Michael Korol, Li Lei, and Vladimir Dikhtyar, IEEE Transactions on Plasma Science, vol. 27, No. 2 (Year: 1999).*

(Continued)

*Primary Examiner* — Maliheh Malek
(74) *Attorney, Agent, or Firm* — Oblon, McClelland, Maier & Neustadt, L.L.P.

(57) ABSTRACT

Described herein is a technology related to a method for generating a high density plasma ionization on a plasma processing system. Particularly, the high density plasma ionization may include an electron cyclotron resonant (ECR) plasma that is utilized for semiconductor fabrication such as an etching of a substrate. The ECR plasma may be generated by a combination of electromagnetic fields from a resonant structure, radiated microwave energy from a radio frequency (RF) microwave source, and presence of a low-pressure plasma region (e.g., about 1 mTorr or less) on the plasma processing system.

18 Claims, 5 Drawing Sheets

(56) References Cited

U.S. PATENT DOCUMENTS

| | | | | | |
|---|---|---|---|---|---|
| 4,632,719 | A * | 12/1986 | Chow | ............... | H01J 37/32623 156/345.46 |
| 4,727,293 | A * | 2/1988 | Asmussen | ............... | H01J 27/16 118/723 MA |
| 4,745,337 | A * | 5/1988 | Pichot | ............... | H01J 37/32623 118/723 AN |
| 4,947,085 | A * | 8/1990 | Nakanishi | ......... | H01J 37/32623 118/50.1 |
| 4,987,346 | A * | 1/1991 | Katzschner | ............. | H01J 37/08 315/111.41 |
| 5,032,202 | A * | 7/1991 | Tsai | ................... | H01J 37/32706 156/345.42 |
| 5,107,170 | A * | 4/1992 | Ishikawa | ................ | H01J 27/18 313/231.31 |
| 5,192,849 | A * | 3/1993 | Moslehi | ............ | H01J 37/32082 156/345.51 |
| 5,261,962 | A * | 11/1993 | Hamamoto | ............ | C23C 16/507 118/723 I |
| 5,277,751 | A * | 1/1994 | Ogle | ..................... | H01J 37/321 118/723 I |
| 5,296,784 | A * | 3/1994 | Geisler | ................ | H01J 37/32229 118/723 AN |
| 5,370,765 | A * | 12/1994 | Dandl | ............... | H01J 37/32192 118/723 MA |
| 5,464,476 | A * | 11/1995 | Gibb | ..................... | H01J 37/321 118/718 |
| 5,490,910 | A * | 2/1996 | Nelson | ................... | C23C 14/345 204/192.15 |
| 5,565,738 | A * | 10/1996 | Samukawa | ........... | H01J 37/3211 315/111.51 |
| 5,571,366 | A * | 11/1996 | Ishii | ................... | H01J 37/32082 156/345.26 |
| 5,614,055 | A * | 3/1997 | Fairbairn | ............... | H01J 37/321 156/345.33 |
| 5,726,412 | A * | 3/1998 | Briffod | ............. | H01J 37/32192 204/298.16 |
| 5,763,851 | A * | 6/1998 | Forster | ................... | H01J 37/321 219/121.43 |
| 5,891,349 | A * | 4/1999 | Tobe | ..................... | C23C 16/509 216/68 |
| 5,936,352 | A * | 8/1999 | Samukawa | ............... | H05H 1/46 315/111.51 |
| 5,975,014 | A * | 11/1999 | Dandl | ............... | H01J 37/32192 118/723 MA |
| 5,998,933 | A * | 12/1999 | Shun'ko | ................... | H05H 1/46 118/723 I |
| 6,028,285 | A * | 2/2000 | Khater | ................. | H01J 37/321 118/723 I |
| 6,030,486 | A * | 2/2000 | Loewenhardt | ........ | H01J 37/321 156/345.46 |
| 6,063,233 | A * | 5/2000 | Collins | ................. | C23C 16/517 156/345.37 |
| 6,158,384 | A * | 12/2000 | Ye | ......................... | H01J 37/321 118/723 AN |
| 6,178,920 | B1 * | 1/2001 | Ye | ......................... | H01J 37/321 118/723 I |
| 6,204,607 | B1 * | 3/2001 | Ellingboe | .............. | H01J 37/321 118/723 I |
| 6,225,592 | B1 * | 5/2001 | Doughty | ........... | H01J 37/32192 118/723 AN |
| 6,273,022 | B1 * | 8/2001 | Pu | ........................ | H01J 37/321 118/723 I |
| 6,297,594 | B1 * | 10/2001 | Sakai | ............... | H01J 37/32192 313/362.1 |
| 6,338,313 | B1 * | 1/2002 | Chan | ....................... | H01J 37/20 118/723 I |
| 6,471,822 | B1 * | 10/2002 | Yin | ....................... | H01J 37/321 118/723 E |
| 6,488,807 | B1 * | 12/2002 | Collins | ............... | C23C 16/507 118/723 I |
| 6,514,390 | B1 * | 2/2003 | Xu | ...................... | H01J 37/3405 204/192.12 |
| 6,551,445 | B1 * | 4/2003 | Yokogawa | ........ | H01J 37/32623 118/723 E |
| 6,632,324 | B2 * | 10/2003 | Chan | ....................... | H01J 37/20 156/345.48 |
| 7,305,935 | B1 * | 12/2007 | Foster | ................... | C23C 14/357 118/723 MA |
| 7,482,757 | B2 * | 1/2009 | Quon | ..................... | H01J 37/321 118/723 IR |
| 7,703,413 | B2 * | 4/2010 | Miebach | .................. | H05H 1/34 118/723 E |
| 7,837,826 | B2 * | 11/2010 | Marakhtanov | .......... | H01J 37/321 156/345.48 |
| 7,990,336 | B2 * | 8/2011 | Maines | ................... | H01J 25/00 343/895 |
| 8,031,824 | B2 * | 10/2011 | Bystriskii | ............... | H05H 1/46 376/107 |
| 8,343,309 | B2 * | 1/2013 | Jeon | ..................... | H01J 37/321 156/345.48 |
| 8,404,080 | B2 * | 3/2013 | Jeon | ..................... | H01J 37/321 156/345.48 |
| 8,444,870 | B2 * | 5/2013 | Godyak | ................. | H05H 1/46 216/68 |
| 8,841,867 | B2 * | 9/2014 | Gilgenbach | ............. | H01J 25/42 315/501 |
| 9,287,096 | B2 * | 3/2016 | Marakhtanov | ....... | H01J 37/3211 |
| 9,431,217 | B2 * | 8/2016 | Mai | ...................... | H01J 37/32568 |
| 10,446,373 | B2 * | 10/2019 | Zimmerman | ....... | H04L 27/1563 |
| 10,913,998 | B2 * | 2/2021 | Chistyakov | ......... | C23C 14/3485 |
| 2001/0037770 | A1 * | 11/2001 | Otsubo | ............... | C23C 16/4405 118/723 I |
| 2002/0002948 | A1 * | 1/2002 | Hongo | ............. | H01J 37/32192 118/723 R |
| 2002/0043621 | A1 * | 4/2002 | Aitken | ................. | H01J 37/3171 250/281 |
| 2002/0069971 | A1 * | 6/2002 | Kaji | ................... | H01J 37/32623 156/345.46 |
| 2003/0062129 | A1 * | 4/2003 | Ni | ...................... | H01J 37/32678 156/345.42 |
| 2003/0136766 | A1 * | 7/2003 | Hoffman | ............. | H01J 37/3266 219/121.43 |
| 2003/0141820 | A1 * | 7/2003 | White | ................... | H01J 37/32623 315/111.21 |
| 2003/0168172 | A1 * | 9/2003 | Glukhoy | ............ | H01J 37/32082 156/345.28 |
| 2004/0003897 | A1 * | 1/2004 | Nishida | ................ | H01J 37/321 156/345.48 |
| 2004/0027293 | A1 * | 2/2004 | Miyake | .................... | H05H 1/46 343/701 |
| 2004/0149218 | A1 * | 8/2004 | Collins | ............. | H01J 37/32412 118/723 I |
| 2004/0155592 | A1 * | 8/2004 | Madocks | ............. | C23C 16/50 315/111.21 |
| 2004/0200417 | A1 * | 10/2004 | Hanawa | ............. | H01J 37/32357 118/723 I |
| 2005/0001554 | A1 * | 1/2005 | Petrin | ............... | H01J 37/32192 315/111.21 |
| 2006/0081466 | A1 * | 4/2006 | Nagashima | ......... | H01J 37/3408 204/298.16 |
| 2006/0254520 | A1 * | 11/2006 | Rostoker | ............ | H01J 37/32678 118/723 I |
| 2006/0289409 | A1 * | 12/2006 | Choi | ..................... | H01J 37/321 219/121.57 |
| 2007/0023398 | A1 * | 2/2007 | Kobayashi | ........ | H01J 37/32706 219/69.12 |
| 2007/0188104 | A1 * | 8/2007 | Chistyakov | .......... | H01J 37/3408 315/111.21 |
| 2007/0221623 | A1 * | 9/2007 | Horiguchi | .......... | C23C 16/45574 216/69 |
| 2008/0017318 | A1 * | 1/2008 | Kobayashi | .......... | C23C 16/4401 156/345.43 |
| 2008/0096305 | A1 * | 4/2008 | Takai | .................... | H01L 31/076 438/96 |
| 2008/0296508 | A1 * | 12/2008 | Small | ...................... | H01J 25/56 250/393 |
| 2009/0032191 | A1 * | 2/2009 | Chistyakov | ............ | H01J 37/34 156/345.44 |

(56) References Cited

U.S. PATENT DOCUMENTS

| | | | |
|---|---|---|---|
| 2009/0095894 A1* | 4/2009 | Koo | H01J 37/3171 250/251 |
| 2009/0220865 A1* | 9/2009 | Ouye | H01J 37/321 430/5 |
| 2010/0075066 A1* | 3/2010 | Ueda | H01J 37/32192 427/575 |
| 2010/0078312 A1* | 4/2010 | Mullapudi | H01J 37/32733 204/192.12 |
| 2010/0105195 A1* | 4/2010 | Roca I Cabarrocas | C23C 16/24 438/485 |
| 2010/0219160 A1* | 9/2010 | Schmidt | C23C 16/511 216/67 |
| 2011/0000783 A1* | 1/2011 | Ohmi | H01J 37/3447 204/192.15 |
| 2011/0057563 A1* | 3/2011 | Obata | H01J 23/213 315/39.55 |
| 2011/0163674 A1* | 7/2011 | Kaufman | H01J 27/16 315/111.51 |
| 2012/0001550 A1* | 1/2012 | Chang | H01J 37/32678 315/111.41 |
| 2012/0027151 A1* | 2/2012 | Bystriskii | H05H 1/24 376/127 |
| 2012/0032756 A1* | 2/2012 | Long | H03H 1/0007 333/181 |
| 2012/0048724 A1* | 3/2012 | McLeod | H01J 37/3452 204/192.12 |
| 2012/0103939 A1* | 5/2012 | Wu | H01J 37/32678 216/70 |
| 2012/0160168 A1* | 6/2012 | Delaunay | H01J 37/32678 118/723 R |
| 2012/0160806 A1* | 6/2012 | Godyak | H01J 37/3211 216/61 |
| 2012/0177542 A1* | 7/2012 | Chang | H05H 1/46 422/186.01 |
| 2012/0252141 A1* | 10/2012 | Sundararajan | H01L 21/31116 438/5 |
| 2013/0084706 A1* | 4/2013 | Zhao | H01J 37/32256 438/710 |
| 2013/0118589 A1* | 5/2013 | Hu | F17D 1/04 137/1 |
| 2013/0119854 A1* | 5/2013 | Lane | H01J 37/32082 313/231.31 |
| 2013/0230974 A1* | 9/2013 | Martinez | H01L 21/68771 438/464 |
| 2013/0321220 A1* | 12/2013 | Toujo | H01Q 1/243 343/702 |
| 2014/0034483 A1* | 2/2014 | Lee | H01J 37/3405 204/192.12 |
| 2014/0035435 A1* | 2/2014 | Weber | G21H 1/00 310/301 |
| 2014/0076715 A1* | 3/2014 | Gorokhovsky | C23C 14/355 204/192.12 |
| 2014/0076716 A1* | 3/2014 | Gorokhovsky | C23C 14/35 204/192.12 |
| 2014/0076718 A1* | 3/2014 | Gorokhovsky | H01J 37/32917 204/192.38 |
| 2014/0077700 A1* | 3/2014 | Chang | H05H 1/24 315/111.51 |
| 2014/0102888 A1* | 4/2014 | Harkness, IV | C23C 14/35 204/298.03 |
| 2014/0124364 A1* | 5/2014 | Yoo | C23C 14/357 204/298.08 |
| 2014/0162465 A1* | 6/2014 | Sporre | H01J 37/32669 438/778 |
| 2014/0262040 A1* | 9/2014 | Zhao | H01J 37/32256 156/345.41 |
| 2014/0272108 A1* | 9/2014 | Holber | H01J 37/321 427/8 |
| 2014/0283747 A1* | 9/2014 | Kasai | H01J 37/3244 118/723 R |
| 2015/0214008 A1* | 7/2015 | Schmidt | H01J 37/32678 315/111.21 |
| 2015/0248994 A1* | 9/2015 | Tandou | H01L 21/6831 156/345.52 |
| 2016/0029472 A1* | 1/2016 | Jevtic | H01J 49/10 250/288 |
| 2016/0064189 A1* | 3/2016 | Tandou | H01J 37/32192 156/345.33 |
| 2016/0071701 A1* | 3/2016 | Lane | H01J 37/32146 156/345.28 |
| 2016/0097118 A1* | 4/2016 | Tanaka | H01J 37/321 427/569 |
| 2016/0217978 A1* | 7/2016 | Mai | H01J 37/32669 |
| 2016/0226212 A1* | 8/2016 | Tajima | H05G 2/00 |
| 2016/0233047 A1* | 8/2016 | Tang | H01J 37/3211 |
| 2016/0300738 A1* | 10/2016 | Zhao | H01J 37/32577 |
| 2017/0032927 A1* | 2/2017 | Koo | H01J 37/14 |
| 2017/0169982 A1* | 6/2017 | Andreev | H01J 23/22 |
| 2018/0047595 A1* | 2/2018 | Kofuji | H01J 37/3211 |
| 2018/0144945 A1* | 5/2018 | Takahashi | H01L 21/6831 |
| 2018/0197718 A1* | 7/2018 | Fayet | C23C 16/545 |
| 2018/0286635 A1* | 10/2018 | Zimmerman | H05H 13/005 |
| 2018/0323043 A1* | 11/2018 | Kraus | H01J 37/32935 |
| 2018/0374670 A1* | 12/2018 | Vandermeulen | H01L 31/1804 |
| 2018/0374688 A1* | 12/2018 | Chistyakov | C23C 14/0605 |
| 2018/0374689 A1* | 12/2018 | Abraham | H01J 37/3467 |
| 2019/0006153 A1* | 1/2019 | Tamari | H01J 37/3222 |
| 2019/0057831 A1* | 2/2019 | Duan | H01J 23/20 |
| 2019/0103254 A1* | 4/2019 | Lane | H01L 21/67069 |
| 2019/0145005 A1* | 5/2019 | Outten | C23C 16/45578 427/569 |
| 2019/0148119 A1* | 5/2019 | Sung | H01L 21/68735 156/345.48 |
| 2019/0246482 A1* | 8/2019 | Zimmerman | B64C 23/005 |
| 2019/0295823 A1* | 9/2019 | Kofuji | H01L 21/6833 |
| 2019/0326023 A1* | 10/2019 | Yang | G21B 1/052 |
| 2019/0341226 A1* | 11/2019 | Lane | H01J 37/3244 |
| 2020/0043775 A1* | 2/2020 | Savas | H01L 21/76826 |
| 2020/0072200 A1* | 3/2020 | Wirz | H01J 27/14 |
| 2020/0090898 A1* | 3/2020 | Vandermeulen | H01J 37/32678 |
| 2020/0303164 A1* | 9/2020 | Lane | H01L 21/67069 |
| 2021/0013005 A1* | 1/2021 | Funk | H01J 37/32559 |

OTHER PUBLICATIONS

"Electron cyclotron resonance plasma source with belt-type magnet assembly and slit antennas", Huijea Lee, Seong Bong Kim, Changho Yi, Seungil Park, Suk Jae Yoo, Moohyun Cho and Won Namkung, Plasma Sources Sci. Technol. 24 015031 (Year: 2015).*

* cited by examiner

RESONANT STRUCTURE FOR ELECTRON CYCLOTRON RESONANT (ECR) PLASMA IONIZATION

BACKGROUND

Fabrication of integrated circuits (IC) in semiconductor industry typically employs plasma processing to create and assist surface chemistry necessary to remove material from—and deposit material to—a substrate within a plasma processing chamber. Examples of plasma processing apparatus include a plasma CVD (Chemical Vapor Deposition) apparatus configured to deposit a thin film on a substrate, and a plasma etching apparatus configured to remove material from a substrate, which can include using an etch mask to define locations for removing material.

In general, such plasma processing apparatus form plasma under vacuum conditions by flowing a process gas into a processing chamber and heating electrons to energies sufficient to sustain ionizing collisions. Heated electrons can have energy sufficient to sustain dissociative collisions. As such, a specific set of gases under predetermined conditions (e.g., chamber pressure, gas flow rate, etc.) may be chosen to produce a population of charged species and/or chemically reactive species. These species may be suitable, for example, to a particular process being performed within the processing chamber.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein is a technology related to a method for generating a high density plasma in a plasma processing system used to manufacture semiconductor devices on a substrate. Particularly, the high density plasma ionization may include an electron cyclotron resonant (ECR) plasma that is utilized for semiconductor fabrication such as etching a semiconductor substrate. It is often desirable in semiconductor substrate processing to operate at a very low pressure. At low pressures the mean free path between collisions of charged and neutral particles with other neutral particles is long. This reduces the effects of charge exchange between ions and neutrals which reduce the average ion energy to the substrate. Low pressure also means that etch by products can travel further before colliding with neutrals. This means that either etch products can be more quickly removed by the action of the vacuum pump or in the case of etch products which have a non-zero sticking probability to allow such particles to stick to material surfaces facing the wafer. The pressure range of interest for the more rapid evacuation of etch by products or reduction of charge exchange is (<10 mTorr) and, for the second process which is applicable in particular, for MRAM processing <1 mTorr. Operation in this pressure regime (<10 mTorr and especially <1 mTorr) is difficult to achieve in any system without using magnetic fields to confine electrons long enough to heat them to the energy required for them to ionize neutrals and hence replace themselves. There are several potential concerns with using magnetic fields for plasma processing, for example, processing uniformity issues, cost, and the desire to minimize the magnetic field at the wafer in order to avoid charging damage. Described herein are systems and methods to circumvent these difficulties by enabling low pressure operation using magnetic fields while providing spatial uniformity control and minimizing the magnetic field at the wafer surface.

In one embodiment, a plasma processing system may include a process chamber intended to ionize process gas, at relatively low pressure, in a more uniform manner by coupling an array of resonant elements distributed along in a resonant structure when microwave energy is transmitted from a microwave transmission antenna or structure at a resonance frequency. The distribution of the resonant elements along the resonant structure may be arranged or optimized to improve energy uniformity across the process chamber. The resonant elements generate localized regions of electromagnetic energy by amplifying the energy from the antenna when the energy is transmitted at a particular frequency, which causes the electromagnetic waves to oscillate at larger amplitude than the original or initial transmission from the antenna. These localized regions of energy are of sufficient amplitude to ionize process gases, at least gas proximate to the resonant structure, such that newly generated electrons will be confined and/or rotate around in the magnetic fields transmitted from an array of magnets distributed around and/or within the resonant elements. In this instance, the electrons are trapped where the magnetic field has a value, such that electron cyclotron frequency is the same as the exciting microwave frequency. When this condition is met, the electromagnetic field couples energy very efficiently into the electron cyclotron motion which heats the electrons. The nature of the coupling increases the heating efficiency of electrons while the magnetic field prevents the spatial loss of electrons especially of high energy electrons which typically escape from non-magnetized plasmas very quickly.

In one embodiment, a resonant structure includes an array of resonant elements, embedded in a ceramic structure, which are designed to resonant at particular microwave frequencies. The magnetic field is provided by permanent magnets, embedded in the ceramic structure, which naturally have magnetic fields which are of sufficient magnitude to allow electron resonance in the microwave frequency regime. In one specific embodiment, the resonant elements have two half loops closest to the plasma and these half loops are concentric around a central permanent magnet embedded in the ceramic structure the north or south face parallel to the plane containing the two half loops. Several permanent magnets may be disposed along a circle outside the two half loops with a counter polarization to the central permanent magnets. Magnetic field lines which leave the face of the central permanent magnet loop and enter the face of one of the outer permanent magnets, forming the magnetic loops which trap the electrons generated by the microwave energy transmitted from the antenna.

In one embodiment, a method for ECR processing using the resonant structure may include receiving a semiconductor substrate on a substrate chuck disposed within a plasma processing chamber. The substrate may include a pattern that provides a mask layer to enable selective etching of portions of the substrate using gas that is flowed into the plasma processing chamber being maintained at sub-atmospheric pressure, generally at less than 10 mTorr. Igniting the plasma may be accomplished by radiating microwave energy from a transmission element coupled to the plasma chamber towards a source component (e.g., resonant structure) disposed between the substrate chuck and the transmission element, the source component including an array of resonant elements with a corresponding group of magnets distributed around or near each of the resonant elements. The transmission element and the resonant elements may form a resonant circuit based, at least in part, on an impedance of the resonant elements and frequency of the microwave energy provided by the transmission element. The impedance being a measurement of the resistance and/or reactance to an alternating current that may be induced by the microwave energy from the transmission element. In most instances, the impedance will be determined by the resonant element geometry, composition, and/or combination thereof. Broadly, the resonant circuit is formed by matching the impedance with a particular frequency that enables the incoming energy to be amplified and to ionize, at least a portion of, the process gas within the chamber, such that free electrons are generated within the process chamber. The localized microwave energy may be coupled with the magnetic field in which the electrons are confined to rotate within a localized region, in which the magnetic field has a value such that the electron cyclotron frequency is the same or similar to the microwave frequency. The electromagnetic field and the static magnetic field which together enable the ECR phenomenon heating electrons which interact with the gas to form plasma or more specifically an ECR plasma proximate to, or along the surface of, the resonance structure, which may be used to treat (e.g., etch or deposit a film) the substrate.

As described herein, the resonant structure may be embedded in a dielectric material that is disposed within an interior volume of a process chamber of the plasma processing system. The resonant structure may include an array of resonant elements and an array of magnets disposed adjacent to the resonant element.

Figure 1:
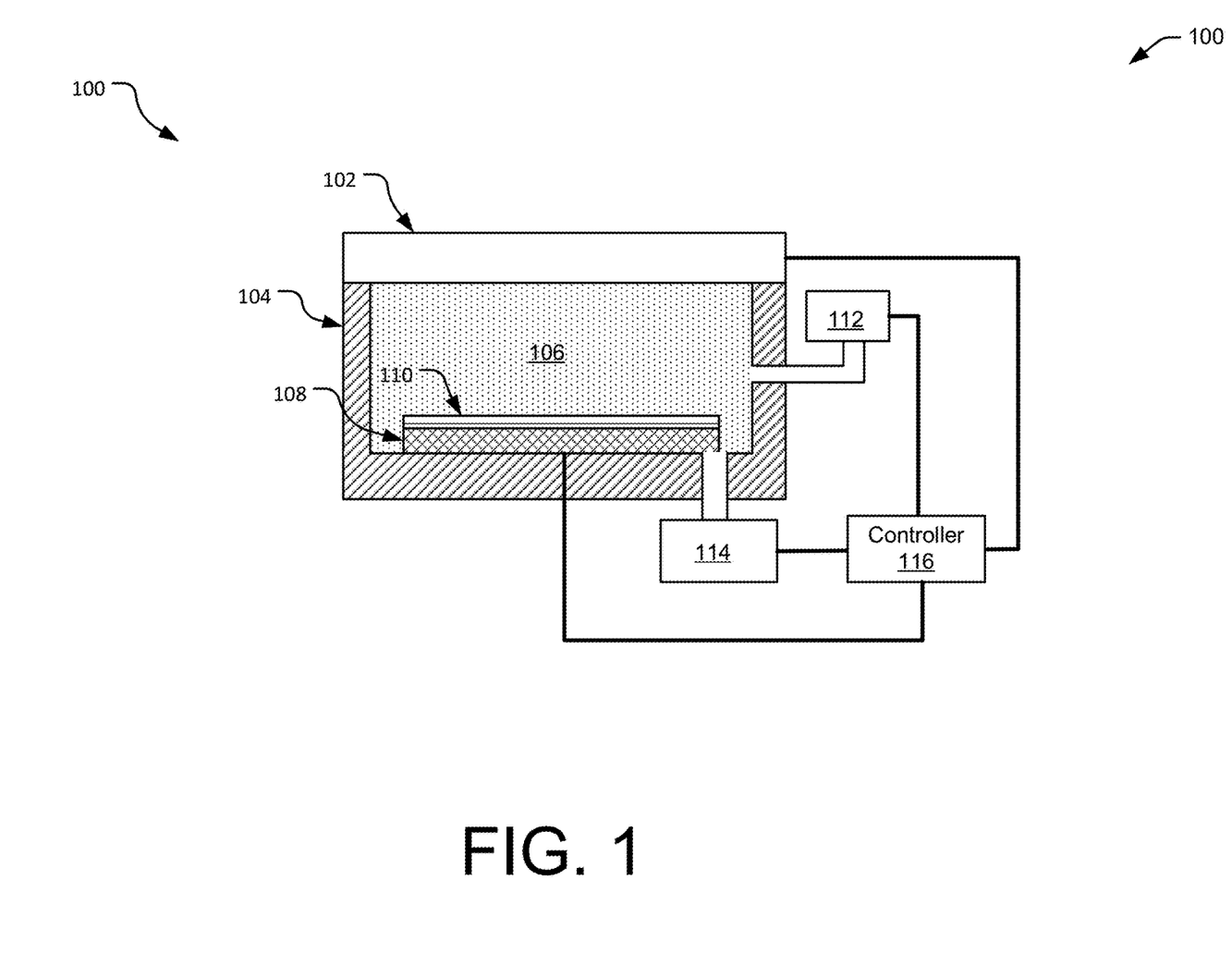
FIG. 1 illustrates an example plasma processing system according to implementations described herein.

FIG. 1 illustrates an example plasma processing system 100 according to implementations described herein. As shown, the plasma processing system 100 may include a transmission element 102, a plasma processing chamber 104, a plasma region 106, a rotatable substrate holder 108 holding a (semiconductor) substrate 110, a gas supply 112, a pump 114, and a controller 116.

The plasma processing system 100 may include a microwave plasma processing apparatus used to modify chemical and physical properties of a gas mixture within an interior volume of the plasma processing chamber 104 to treat the surface of the substrate 110 disposed within the interior volume. For example, the plasma processing system 100 may be utilized for etching purposes, or for a plasma enhanced deposition processes. In this example, the microwave plasma processing apparatus generates plasma such as the ECR plasma to modify the chemical and physical properties of the substrate 110.

The processing chamber 104 may enclose the plasma region 106, within the interior volume, where radiated microwave power or energy may be transmitted over a microwave energy transmission network (not shown) to form, control, or modulate plasma in conjunction with a resonant structure (not shown). The resonant structure, for example, may be disposed within the processing chamber 104 to provide high uniformity during etching or treating of the substrate by the ECR plasma.

As described herein, the ECR plasma may result from a combination of the radiated microwave power from the transmission element 102 and the electromagnetic fields from the resonant structure. We will refer in what follows to the "resonant electromagnetic fields" to mean the fields which primarily arise due to the presence of the resonant elements as opposed to the electromagnetic fields which may come directly from the transmission element. In this example, the combination of the radiated microwave power and the resonant electromagnetic fields may produce uniform spreading of the plasma from the transmission element 102 to the substrate 110. That is, even though the plasma may be generated at some distance from the substrate 110, the resonant structure may provide improve uniformity by generating ECR plasma more evenly across the process chamber 104.

The plasma processing system 110 may further include a pump 114 that may be configured, for example, to control pressure within the processing chamber 104. The pump 114 may be coupled to the controller 116 that may be configured to control and organize steps for the etching and plasma enhanced deposition processes. Similarly, the system 110 may include a gas distribution network 112 capable of supplying inert gas, etchant gas, or a combination thereof. For example, the inert gases may include but are not limited to, argon, and nitrogen and the etchant gas may include, but is not limited to, oxygen, carbon dioxide, fluorocarbon-based chemistry, and/or a combination thereof.

Figure 2:
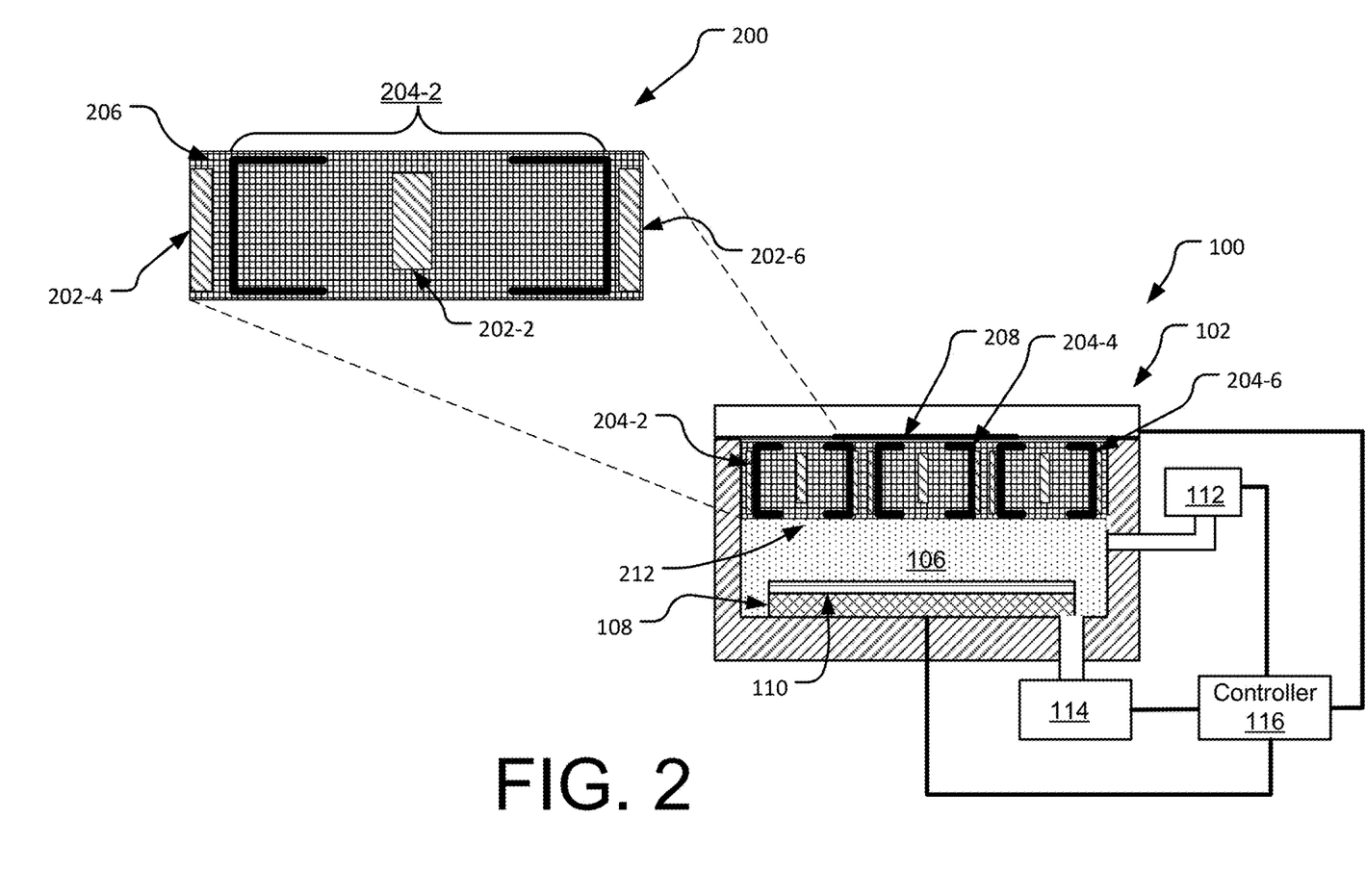
FIG. 2 illustrates an example schematic representation of a plasma processing system with a resonant structure for generating resonant electromagnetic fields as described herein.

FIG. 2 illustrates an example schematic representation of the example plasma processing system 100 with a resonant structure 200 for generating electromagnetic fields and magnetic fields as described herein.

The resonant structure 200 (or a source component) may include an array of magnets 202, and array of resonant elements 204, which are embedded in a dielectric material 206. The dielectric material 206 may include any ceramic material capable of withstanding the process chemistry or electromagnetic energy used to generate plasma within the process chamber 104. For example, the ceramic material may include, but is not limited to, yttrium oxide or aluminum oxide.

As described herein, a low-pressure environment of lesser than 10 mTorr may be maintained within the plasma region 106. For example, the controller 116 may be configured to control the gas supply 112 in supplying ionization gas within the plasma region 106 via a gas distribution network. In this example, the low-pressure measurements within the plasma region 106 may be limited to about 10 mTorr or below.

With the low-pressure environment of about 10 mTorr or less, the resonant structure 200 may generate the electromagnetic fields and magnetic fields proximate to a plasma surface 212 of the resonant structure 200 and away from the substrate 110. The presence of these electromagnetic fields and the magnetic fields make possible the creation and sustenance of the plasma within the plasma region 106 even at a low-pressure of about or less than 1 mTorr.

To form plasma or ECR plasma, the radiated microwave energy from the transmission element 102 is combined with the electromagnetic fields (not shown) and/or the magnetic fields (not shown) generated by the resonant structure 200. The resonant structure 200 may include an array of resonant elements 204 disposed within the dielectric material 206 and, a corresponding array of magnets 202 (202-2, 202-4, 202-6) disposed around the resonant element 200. The arrangement and polarity of the array of magnets 202 may be designed to form a magnetic field (not shown) that extends between the inner magnets (e.g., first magnet 202-2) and the outer magnets (e.g., first magnet 202-4 and third magnet 202-6). The resonant structures 200 and the microwave source 102 may be energized to ionize process gases, such that gas molecules lose electrons which are then confined by the magnetic field. In addition there is good energy transfer between the electromagnetic fields and the electrons at the points where the magnetic field has a magnitude, such that the electron cyclotron frequency is the same or similar to the microwave frequency. Electron cyclotron motion refers to electrons that rotate about a magnetic field line in a circular motion in which the angular frequency of this cyclotron motion is governed by equation (1), wherein CD is angular frequency, e is elementary charge (e.g., 1.69×10$^{-19}$), B is the magnetic field strength, and $m_e$ is the electron rest mass of a single electron (e.g., 9.1×10$^-$$_{31}$). The electron cyclotron motion is said to be resonant when the angular frequency is the same as the angular frequency of the electromagnetic fields.

$$\dot{\omega} = \frac{eB}{m_e} \quad (1)$$

For example, the cyclotron resonance for 2.45 GHz exists when the magnetic field strength, B, is equal to, or about, 875G. In this instance, the electrons which rotate around a particular portion of magnetic field line whose magnitude is ~875 G will be perfectly synchronized with electromagnetic waves which oscillated at 2.45 GHz. When the electron cyclotron motion and the electromagnetic fields are thus synchronized, power is transferred very efficiently from the fields to the electrons, heating them to an energy where they can ionize neutral background gas. In this way the combination of enhanced electromagnetic fields due to the resonant structures and the static magnetic fields which cause electron cyclotron motion, enable a relatively higher density plasma, along the plasma surface 212 of the dielectric material 206 opposite the substrate holder 108, than could be achieved without the resonant structure.

In the FIG. 2 embodiment, the resonant element 204-2 may form an inductor-capacitance (LC) resonant circuit, which may include a 20 micron thick metal layer that may be folded to form a loop or half loop at both ends, such that a portion of the resonant element 204-2 may be opposite and/or parallel to the transmission element 208 that may induce current flow within the resonant element 204-2 to generate electromagnetic fields that can extend outside of the dielectric material 206. The resonant element's 204 electromagnetic fields, in conjunction with the static magnetic fields, from the magnets 202-2 to 202-6, may confine electrons within a localized region proximate to each of magnets 202-2 to 202-6. If the resonance frequency is applied to the resonant elements 204 their corresponding electromagnetic fields will increase electron density within these localized regions and induce the electrons to rotate around the magnetic field lines at a relatively greater velocity to form the ECR plasma within the plasma region 106.

The resonance frequency of the resonant structure 200 may be based, at least in part, on the height, width, radius, type of material, and/or relative position of the resonant elements 204 disposed within the dielectric material 206. For example, the end-to-end distance between the loops of the resonant elements 204 may range from 1 mm to 50 mm, and the radius of the loop may range from 1 mm to 20 mm. However, the dimensions may vary, lower or higher, depending on the ECR application and the process conditions or process application in order to form a resonant circuit between the transmission element 102 and the resonant structure 200 (e.g., resonant elements 204). For example, the geometric size of the resonant structures 200 and/or the resonant elements 204 may be equal or considerably smaller than the free space wavelength of the electromagnetic radiation at the resonant frequency. In another embodiment, the resonant elements 204 may include a pair of magnetic coupling coils (not shown) which couple the resonant element 204 to the power source (not shown). Each of the magnetic coupling coils may terminate in a pair of capacitive components with a top plate on the coil and a bottom plate, opposite and/or parallel to the top plate that is a portion of a resonant LC circuit disposed with the dielectric material 206. The bottom plate may be connected to one end each of two half circle loops acting as inductive components that may be opposite and/or parallel the bottom plate. Therefore, there are two inductive loops within the resonant circuit. The capacitive and inductive elements form an LC circuit within the dielectric material 206. In such a resonant circuit, stored energy is exchanged between the capacitors and the inductors at the resonant frequency. In certain implementations, the inductive and capacitive components of the array have identical dimensions. In certain implementations, the inductive 212a and 212b and capacitive components 210 and 211 of the array have different dimensions. The resonant circuit may be representative of the resonant elements 204 being positioned in such a way that the changing magnetic fields produced by the inductive elements extend into the process chamber 104. Under Faraday's law, the changing magnetic fields produce oscillating electric fields and this changing electric field together with the static magnetic fields from the magnets 202 couple to electrons within the ionized gas in the process chamber 103 to generate and sustain ECR plasma used to treat the substrate 110. In one specific embodiment, permanent magnets will maintain a static field and their magnetic field may not vary in time, which is desirable in most applications. However, in other embodiments, electromagnets or non-permanent magnets may vary their magnetic field via current flow, but may also be considered static magnets for the purposes of this disclosure, such that current to the electromagnets may vary on a time scale that is much longer than the electromagnetic wave time scale (e.g., ms vs. ns).

In many embodiments, the array of magnets 202 may be distributed within and around an outer perimeter of each resonant element to form the magnetic field proximate to the resonant element and an exterior surface of the resonant structure. Each magnet includes a particular dimension or size. Furthermore, each magnet may be positioned at a certain distance from another magnet. In this case, the dimension or size, and positioning of the magnets provide the magnetic fields that match the generated electromagnetic fields from the resonant element in order to generate a resonance between the electromagnetic fields and the electron cyclotron motion. For example, in one particular embodiment, the array of magnets may include groups of magnets distributed and/or positioned within and around an outer perimeter of each a corresponding resonant element for the group of magnets. For example, an array of magnets includes groups of two or more magnets with at least one magnet having a different magnetic orientation from the other magnets. This embodiment may be used localize the magnetic fields around their corresponding resonant elements 204 to achieve ECR plasma. In contrast, in another embodiment, the array of magnets comprise groups of two or more magnets having the same magnetic orientation, such that the magnetic fields are less localized and extend away from the resonant structures extending in some cases to the wafer.

In the FIG. 2 embodiment, the resonant structure 200 may include an array of magnets 202 that are positioned or distributed within and around an outer perimeter of each of the resonant elements 204-2 to 204-6, such that the array of magnets comprise groups of two or more magnets with at least one magnet having a different magnetic orientation from the other magnets. As shown in FIG. 2, a first magnet 202-2 may be disposed on a center of the resonant element loop 204-2 where the first magnet 202-2 may include a positive polarity. On the other hand, a second magnet 202-4 and a third magnet 202-6, which are configured to have negative polarities, may be positioned along the outer perimeter of the resonant element loop 204-2. In this case, the setup of the plurality of magnets 202 and the configuration of the resonant element loop 204-2 may create the resonance between the electromagnetic fields and the electron cyclotron motion across the resonant element loop 204-2

The plurality of magnets 202 may be configured to have a certain amount of magnetic induction depending upon the resonant electromagnetic fields to be generated. For example, for 200 MHz resonant electromagnetic fields frequency, the plurality of magnets 202 may have a magnetic induction of about 70 Gauss. In this example, each magnet 202 may be positioned to trap the electrons along the electromagnetic fields of the resonant element 204. In this manner, the resulting resonant electromagnetic fields may facilitate an increase plasma density in the ECR plasma proximate to the plasma surface 212.

Figure 4:
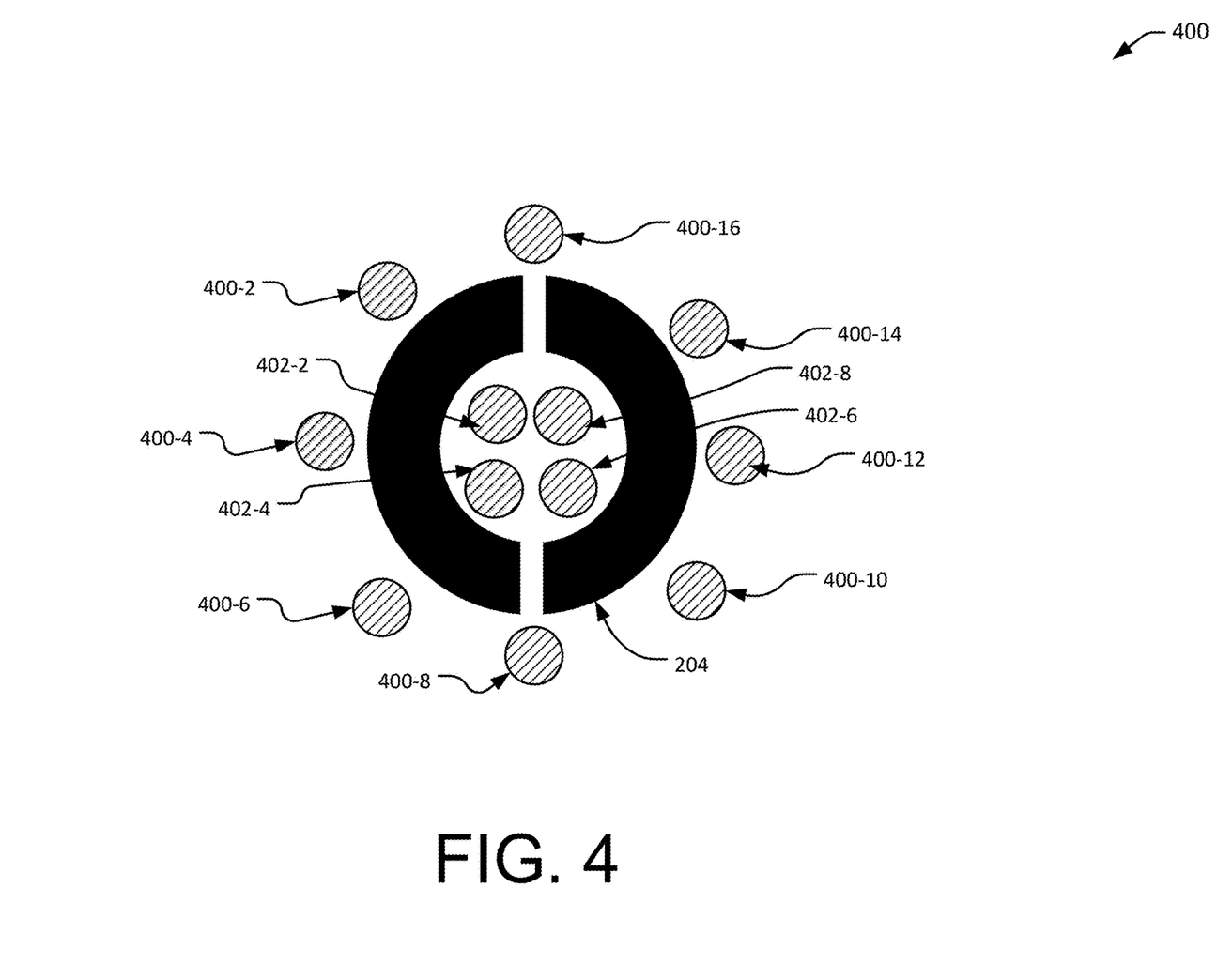
FIG. 4 illustrates an example implementation of the resonant structure as described herein.

In certain embodiments, the frequency of the energy provided by the resonant structure 200 and the transmission element 102 102 may increase the rotation velocity of the electrons within the electromagnetic fields. These velocities may vary depending upon arrangement and/or the design of microwave source 102, resonant elements 204, magnets 202, type of dielectric material 206, or any combination thereof. Generally, the electromagnetic wave frequency at which high plasma ionization is generated due to this increase or spike in electron density may be referred to as a resonance frequency. This phenomena is evidenced by electrons, within the ionized gas, rotating or oscillating with greater amplitude when electromagnetic energy is applied at certain frequencies, when compared with other frequencies when the phenomena does not occur. The resonance phenomena may also increase plasma density proximate to the resonant element 204 and magnet pairings 400,402. In some instances, the plasma density will be greater near the plasma surface 212 than at other locations further away from the resonant structure 200.

Although not shown in FIG. 2, liquid cooling channels may be embedded on the dielectric material 206 and proximate to locations of the magnets 202 in order to provide a regulated temperature on the resonant structure 200.

Figure 3:
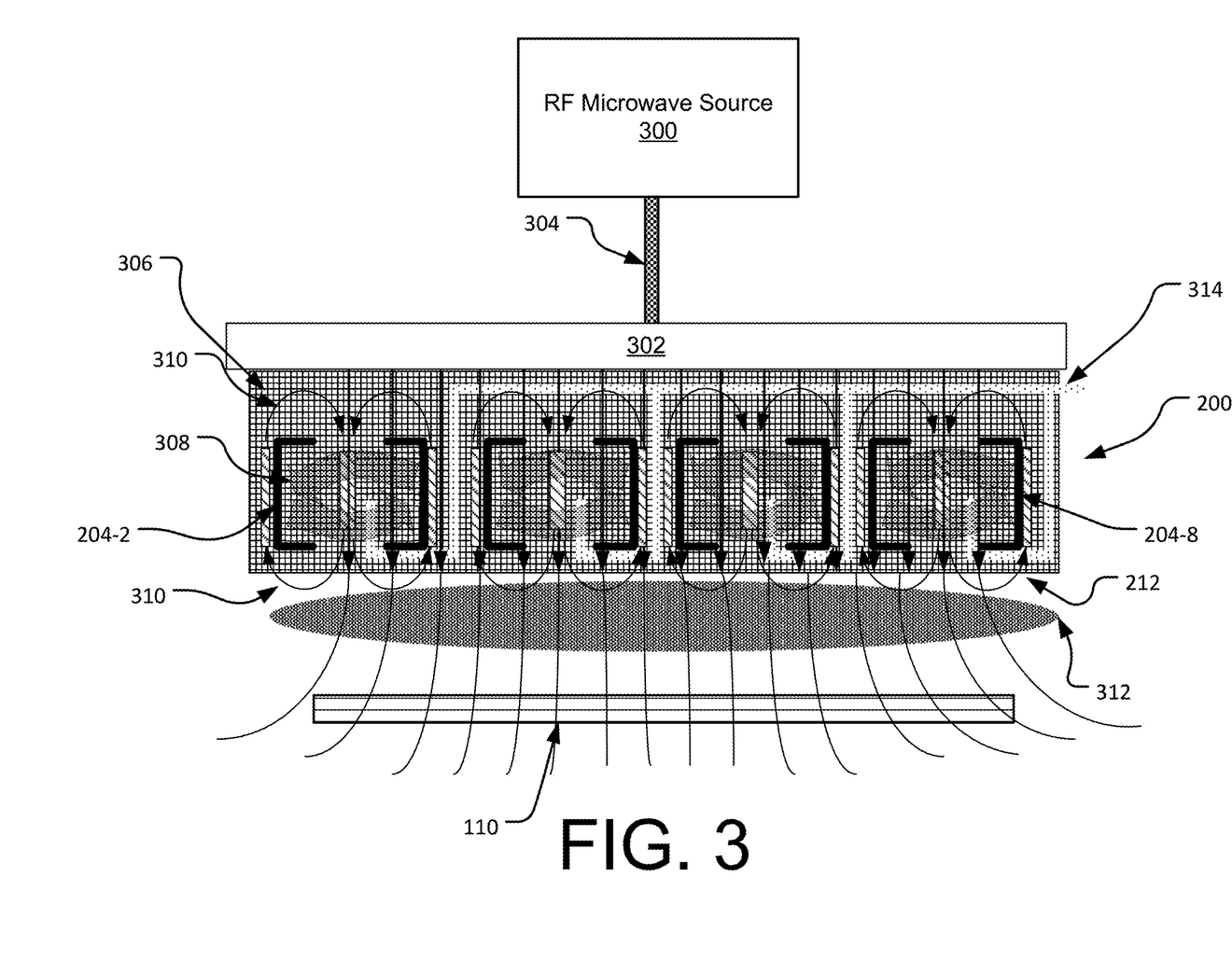
FIG. 3 illustrates an example implementation of the technology as described herein.

FIG. 3 illustrates an example implementation of the technology as described herein. Particularly, the example implementation of FIG. 3 is used for generating the ECR plasma with high uniformity during the treating of the substrate 110.

As shown, the microwave energy transmission network includes an RF microwave source 300 that is connected to a microwave power source 302 through a waveguide 304 in order to radiate microwave energy 306. Furthermore, FIG. 3 shows magnetic fields 310, from the array of magnets 202, that interact with the microwave energy 306, and the electromagnetic energy (not shown) from the resonant elements 204 to form localized regions of higher electron density within the magnetic fields 310.

The RF microwave source 300 may be used to generate plasma 312, by ionizing gas, within the process chamber 104, which results in freeing electrons that may be used to form ECR plasma as described herein. The RF microwave source 300 may generate microwave energy in 300 MHz to 300 GHz range to enable the ECR plasma. However, for this range and particularly at GHz range, bigger magnetic induction may be required for the array of magnets 202. In an embodiment, the RF microwave source 300 may be used to generate VHF frequency that may generate ECR plasma using a smaller array of magnets 202. For example, at 250 MHz electromagnetic energy, a magnetic induction of about 100 Gauss may require smaller magnets 202 to be disposed around the resonant element 204.

As described herein, a liquid cooling channel 314 may be further embedded in between the array of resonant element loops 204 in order to cool down the permanent magnets 202. For example, the liquid cooling channel 314 includes a heat transfer element that sends a fluid mixture through passages of the heat transfer element to pick up heat from the resonant structure 200. In this example, liquid cooling channel 314 may sustain efficiency and further provides durability for the resonant structure 200.

FIG. 4 illustrates an example implementation of the resonant structure 200 as seen from the bottom view or from the point of view of the substrate holder 110. As shown, an example resonant element 204 is surrounded by a plurality of magnets 400, which are positioned along a perimeter of the resonant element 204, and another set of permanent magnets 402 that are disposed between the components of the resonant element 204.

As described herein, the polarities of the small perimeter magnets 400 and the permanent magnets 402 are configured to generate magnetic fields 308 across the resonant element 204 and the plasma surface 212. For example, each of the plurality of small magnets 400-2 to 400-16 includes South polarity, while the set of permanent magnets 402-2 to 402-8 include North polarities. In this example, the sizes and distances of the plurality of small magnets 400 from each other are configured to enable the charge distribution along the plasma surface 212. Similarly, the sizes and distances of the set of permanent magnets 402 from each other are configured to generate the charge distribution for the resonant electromagnetic fields.

Figure 5:
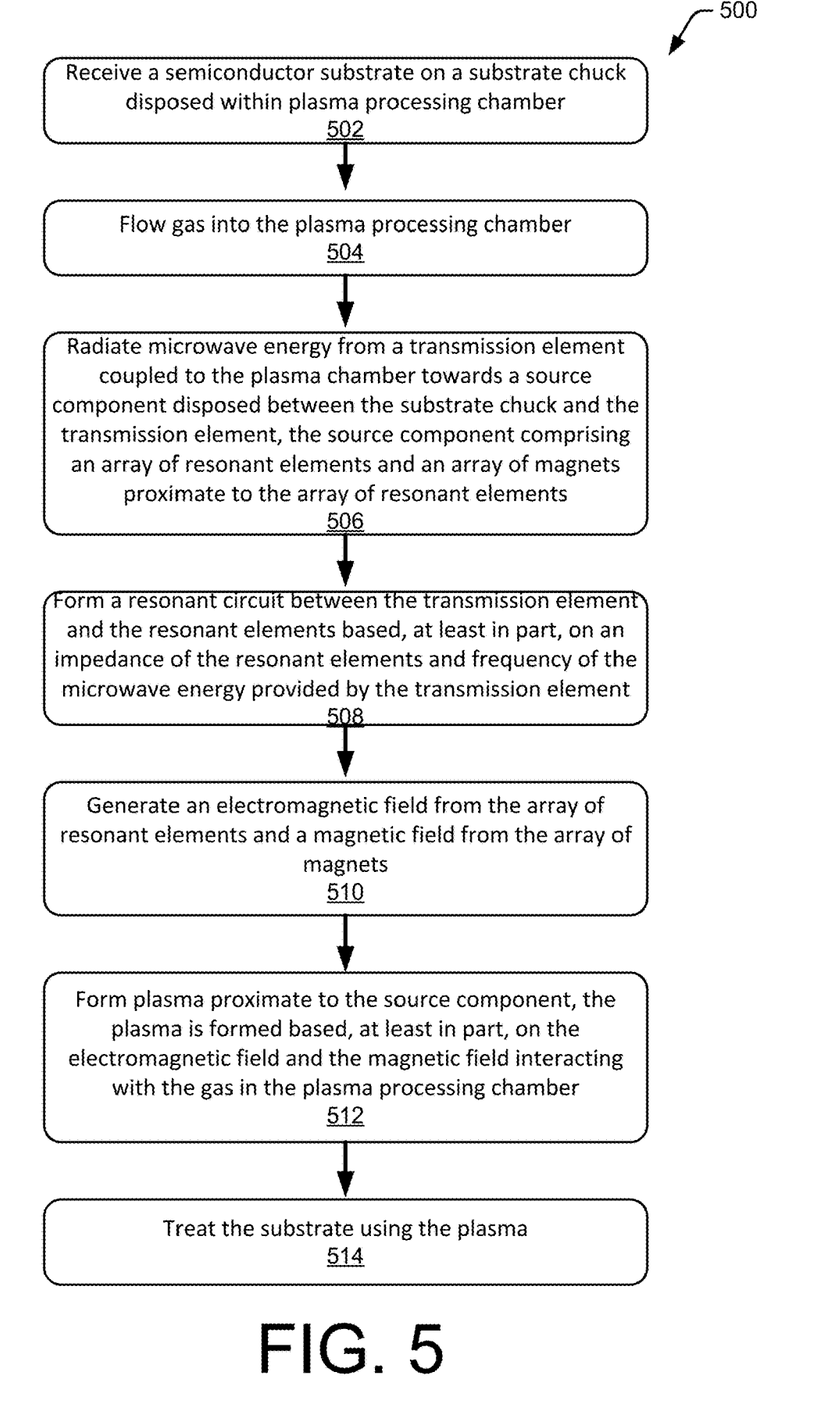
FIG. 5 shows an example process chart illustrating an example method for generating plasma for semiconductor fabrication as described herein.

FIG. 5 shows an example process chart 500 illustrating an example method for generating ECR plasma for semiconductor fabrication as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, receiving a semiconductor substrate 110 on a substrate chuck disposed within a plasma processing chamber is performed. For example the rotatable substrate holder 108 includes the substrate chuck to hold the semiconductor substrate 110. In this example, the semiconductor substrate 110 such as the metal film stack is received by the substrate holder 108.

At block 504, flowing gas into the plasma processing chamber while maintaining a low-pressure environment by controlling gas flow within the plasma processing chamber is performed. For example, the controller 116 may be operated to control the gas supply 112 to deliver gas to the interior volume. In one embodiment, the low-pressure environment within the plasma region 106 may be limited to about 10 mTorr or below, while flowing one or more processes gases in to the plasma processing chamber, which may include, but is not limited to, argon, nitrogen, oxygen, carbon dioxide, fluorocarbon-based chemistry, and/or a combination thereof. In one specific embodiment, the pressure may be limited to less than 1 mTorr to enable ECR plasma formation, particularly for MRAM metal film stack etching that incorporates one or more metal films disposed on the substrate. The controller 116 will operate to confirm the pressure and gas flow conditions are at desired set points to enable plasma ignition within the plasma processing chamber.

At block 506, the controller 116 may be the plasma ignition process by radiating microwave energy from a transmission element 102 coupled to the plasma chamber towards a resonant structure 200 or source component disposed between the substrate chuck and the transmission element, the source component or resonant structure 200 which may include the array of resonant elements 204 and the array of magnets 400, 402 proximate to the array of resonant elements In one embodiment, the transmission element 102 may be powered by a microwave power source 302 to radiate microwave energy 306 towards the direction of the resonant structure 200. In this example, the microwave energy 306 may be in the VHF frequency range of 100-200 MHz. In this VHF frequency range, the resonant element 204 may be include, for example, a continuous coil that is folded at both ends to form a resonant element loop. In this example, the formed resonant element loop may include an enhanced capacitance at each end. In some embodiments, the resonant element loop may be designed to form a resonant circuit at certain frequencies of microwave energy provided by the transmission element 102.

At block 508, when the transmission element 102 transmits microwave energy at a predetermined frequency (e.g., resonance frequency) towards the resonant elements 204, a resonant circuit may be formed between the transmission element 102 and the resonant elements based, at least in part, on an impedance of the resonant elements 204 and frequency of the microwave energy provided by the transmission element 102. The impedance being a measurement of the resistance and/or reactance to an alternating current that may be induced by the microwave energy from the transmission element 102. In most instances, the impedance will be determined by the resonant element geometry, composition, and/or combination thereof.

At block 510, the resonant elements 204, based at least in part, on the resonance phenomena may generate an electromagnetic field from the array of resonant elements 204 and be coupled with magnetic fields from the array of magnets 400, 402. In one embodiment, the microwave energy from the transmission element 102 comprises an amplitude being less than an amplitude of the electromagnetic energy radiating from the array of resonant elements 204. The radiating electromagnetic energy and magnetic field from resonant structure 200, which is disposed between the substrate chuck and the transmission element 102, such that the coupling of the electromagnetic energy from the resonant elements 204 and magnetic fields from the magnets 400, 402 create free electrons within the process gas which are trapped in the magnetic field and rotate with an angular velocity as governed by equation (1).

At block 512, the energy from the transmission element 102, the resonant structure 200, and/or the rotating electrons may enable ECR plasma to form proximate to a surface of the resonant structure 200. The surface being opposite the substrate holder 108. In one specific embodiment, the ECR plasma is formed based, at least in part, on the electromagnetic field and the magnetic field interacting with the gas in the plasma processing chamber. In some instances, the plasma is formed based, at least in part, on the microwave energy from the transmission element 102.

At block 514, treating the semiconductor substrate using the ECR plasma k performed. For example, the high density plasma ionization 308 may be utilized to etch the substrate 110 by using the ions in the ECR plasma that may be accelerated toward the substrate 110. In one embodiment, the substrate holder 108 may include a powered electrode that may create a potential difference between the resonant structure 200 and the substrate holder 108, such that the ions would accelerated towards the substrate 110 and impact the substrate 110.

What is claimed is:

1. A method of semiconductor fabrication comprising:
receiving a semiconductor substrate on a substrate chuck disposed within a plasma processing chamber;
flowing gas into the plasma processing chamber;
radiating microwave energy from a transmission element coupled to the plasma chamber towards a source component disposed between the substrate chuck and the transmission element, the source component comprising an array of resonant elements and an array of magnets proximate to the array of resonant elements;
forming a resonant circuit between the transmission element and the resonant elements based, at least in part, on an impedance of the resonant elements and frequency of the microwave energy provided by the transmission element;
generating an electromagnetic field from the array of resonant elements and a magnetic field from the array of magnets based, at least in part, on forming the resonant circuit;
forming plasma proximate to the source component, the plasma is formed based, at least in part, on the electromagnetic field and the magnetic field interacting with the gas in the plasma processing chamber; and
treating the substrate using the plasma.

2. The method of claim 1, wherein the plasma is formed based, at least in part, on the microwave energy from the transmission element.

3. The method of claim 1, wherein array of magnets comprise groups of two or more magnets with at least one magnet having a different magnetic orientation from the other magnets.

4. The method of claim 1, wherein the array of magnets comprise groups of two or more magnets having the same magnetic orientation.

5. The method of claim 1, wherein the resonant elements comprise a coil and/or an inductor capacitor (LC) resonant circuit.

6. The method of claim 1, wherein the microwave energy from the transmission element comprises an amplitude being less than an amplitude of the electromagnetic energy from the array of resonant elements.

7. The method of claim 1, wherein the impedance is based, at least in part, on material composition and/or geometry of the resonant element.

8. The method of claim 1, wherein the low-pressure environment comprises a pressure of below 1 mTorr.

9. A device for semiconductor fabrication comprising:
a process chamber comprising an interior volume and a substrate holder disposed within the interior volume;
a gas supply network fluidly coupled to the interior volume;
a microwave energy transmission network coupled to the process chamber;
a transmission element, disposed within the interior volume, coupled to the microwave energy transmission network, wherein the transmission element comprises an antenna coupled to the microwave energy transmission network; and
a resonant structure, disposed within the interior volume, comprising an array of resonant elements and an array of magnets proximate to a corresponding resonant element,
wherein the array of magnets comprises groups of magnets distributed and/or positioned within and around an outer perimeter of the corresponding resonant element.

10. The device of claim 9, wherein the resonant structure comprises a liquid cooling channel proximate to at least one magnet of the array of magnets.

11. The device of claim 9, wherein the resonant structure is disposed between the substrate holder and the transmission element within the interior volume.

12. The device of claim 9, wherein the resonant elements are embedded in a ceramic material, and the resonant element comprises a metal or conductive structure.

13. The device of claim 12, wherein the ceramic material comprises yttrium oxide or aluminum oxide.

14. The device of claim 9, wherein the array of magnets comprise groups of two or more magnets having the same magnetic orientation.

15. The device of claim 9, wherein the array of magnets comprise groups of two or more magnets with at least one magnet having a different magnetic orientation from the other magnets.

16. A device, comprising:
a source component for generating electromagnetic fields and magnetic fields comprising a ceramic material;
an array of resonant elements disposed within the source component, the resonant element(s) comprising a metal structure comprising a loop or half-loop feature; and
an array of magnets disposed within the source component, the array of magnets comprising groups of two or more magnets distributed around a corresponding resonant element,
wherein two or more magnets are distributed and/or positioned within and around an outer perimeter of the corresponding resonant element.

17. The device of claim 16, wherein the source component comprises a heat transfer element.

18. The device of claim 17, wherein the heat transfer component comprises a distribution network for a fluid mixture, the distribution network comprising fluid channels disposed within the source component.

* * * * *